United States Patent
Du

(10) Patent No.: US 12,230,668 B2
(45) Date of Patent: Feb. 18, 2025

(54) METHOD FOR MANUFACTURING SEMICONDUCTOR STRUCTURE, SEMICONDUCTOR STRUCTURE, AND MEMORY

(71) Applicant: CHANGXIN MEMORY TECHNOLOGIES, INC., Hefei (CN)

(72) Inventor: Yonghao Du, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 451 days.

(21) Appl. No.: 17/452,644

(22) Filed: Oct. 28, 2021

(65) Prior Publication Data
US 2022/0102481 A1 Mar. 31, 2022

Related U.S. Application Data
(63) Continuation of application No. PCT/CN2021/106921, filed on Jul. 16, 2021.

(30) Foreign Application Priority Data
Sep. 29, 2020 (CN) .......................... 202011057546.2

(51) Int. Cl.
H01L 49/02 (2006.01)
(52) U.S. Cl.
CPC .............. *H01L 28/60* (2013.01); *H01L 28/56* (2013.01)
(58) Field of Classification Search
CPC ...................................................... H01L 28/56
See application file for complete search history.

(56) References Cited

U.S. PATENT DOCUMENTS

| 10,825,893 | B2 | 11/2020 | Cho et al. |
| 2005/0152094 | A1* | 7/2005 | Jeong .................. H01L 27/0805 361/312 |
| 2019/0165088 | A1 | 5/2019 | Cho et al. |
| 2021/0359082 | A1* | 11/2021 | Kang .................... H10B 53/30 |

FOREIGN PATENT DOCUMENTS

| CN | 108962898 A | 12/2018 |
| CN | 208352341 U | 1/2019 |
| CN | 109841622 A | 6/2019 |
| CN | 209183578 U | 7/2019 |
| CN | 110690346 A | 1/2020 |
| CN | 111261774 A | 6/2020 |
| KR | 20100037970 A | 4/2010 |

OTHER PUBLICATIONS

S. Ramesh et al. "Comparison between microwave and conventional sintering on the properties and microstructural evolution of tetragonal zirconia" Ceramics International, 44 (2018); available Feb. 16, 2018. (Year: 2018).*
CN first office action in application No. 202011057546.2, mailed on Dec. 17, 2024.

* cited by examiner

*Primary Examiner* — John A Bodnar
(74) *Attorney, Agent, or Firm* — Syncoda LLC; Feng Ma

(57) ABSTRACT

A method for manufacturing a semiconductor structure includes the following operations. A substrate is provided. A lower electrode is formed on the substrate. A capacitor dielectric layer is formed on a surface of the lower electrode. The capacitor dielectric layer includes at least one zirconium oxide layer. The capacitor dielectric layer is subjected with microwave annealing treatment to convert a crystal phase of zirconium oxide to a tetragonal crystal phase. An upper electrode is formed on a surface of the capacitor dielectric layer.

13 Claims, 10 Drawing Sheets

METHOD FOR MANUFACTURING SEMICONDUCTOR STRUCTURE, SEMICONDUCTOR STRUCTURE, AND MEMORY

CROSS-REFERENCE TO RELATED APPLICATIONS

This is a continuation of International Application No. PCT/CN2021/106921 filed on Jul. 16, 2021, which claims priority to Chinese Patent Application No. 202011057546.2 filed on Sep. 29, 2020. The disclosures of these applications are hereby incorporated by reference in their entirety.

BACKGROUND

A Dynamic Random Access Memory (DRAM) is a common semiconductor storage device, and is composed of a large number of repeated storage units. The DRAM can only retain data for a very short time. Therefore, in order to retain data, a capacitor is used to store data. The capacitor is an electronic element for storing energies in the form of electrostatic field. The capacitor generally includes an upper electrode, a lower electrode, and a dielectric layer between the two electrodes. A capacitance of the capacitor is directly proportional to a surface area of a polar plate and a dielectric constant of the dielectric layer, and is inversely proportional to a distance between polar plates.

It should be noted that the information disclosed herein is only used to enhance the understanding of the background of the disclosure, and therefore may include the information that does not constitute related art known to a person of ordinary skill in the art.

SUMMARY

The disclosure relates to the technical field of semiconductors, and in particular, to a method for manufacturing a semiconductor structure, a semiconductor structure, and a memory.

According to the first aspect of embodiments of the disclosure, a method for manufacturing a semiconductor structure is provided and includes the following operations.

A substrate is provided.

A lower electrode is formed on the substrate.

A capacitor dielectric layer is formed on a surface of the lower electrode, and includes at least one zirconium oxide layer.

The capacitor dielectric layer is subjected with a microwave annealing treatment, to convert a crystal phase of zirconium oxide to a tetragonal crystal phase.

An upper electrode is formed on a surface of the capacitor dielectric layer.

According to the second aspect of embodiments of the disclosure, a semiconductor structure is provided, and includes: a substrate; a lower electrode, located on the substrate; a capacitor dielectric layer, provided on a surface of the lower electrode, and including at least one zirconium oxide layer, where a crystal phase of zirconium oxide of the zirconium oxide layer is a tetragonal crystal phase; and an upper electrode, provided on a surface of the capacitor dielectric layer away from the lower electrode.

According to the third aspect of embodiments of the disclosure, a memory is provided, and includes: a semiconductor structure manufactured by the method for manufacturing a semiconductor structure in the first aspect.

BRIEF DESCRIPTION OF THE DRAWINGS

The accompanying drawings are incorporated in and constitute a part of the description, illustrate embodiments in line with the disclosure and, together with the description, serve to explain the principles of the disclosure. It is apparent that the accompanying drawings in the following description show only some embodiments of the disclosure, and a person of ordinary skill in the art may still derive other accompanying drawings from these accompanying drawings without creative efforts.

DETAILED DESCRIPTION

Figure 1:
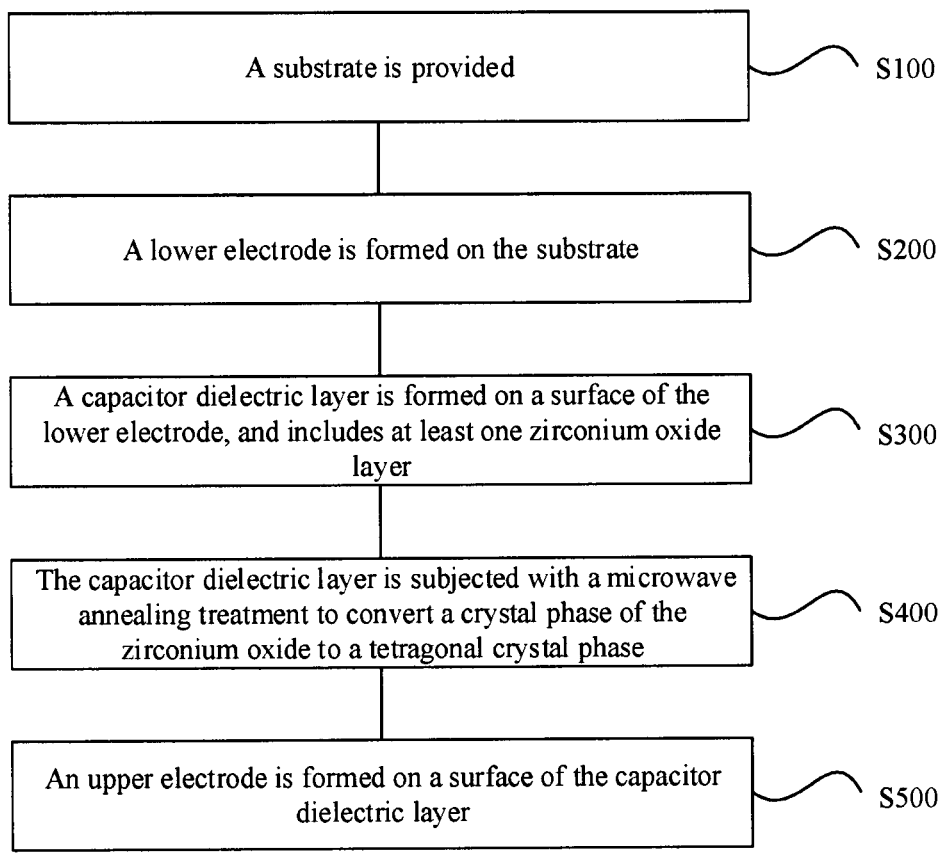
FIG. 1 shows a flowchart of a method for manufacturing a semiconductor structure in exemplary embodiments of the disclosure.

Exemplary implementations are now described more comprehensively with reference to the accompanying drawings. However, the exemplary implementations can be implemented via various means, and should not be understood as the limitation to those described herein. Instead, providing these implementations makes the disclosure more comprehensive and complete, and makes a person skilled in the art comprehensively understand the idea of the exemplary implementations. The same reference numerals in the accompanying drawings represent the same or similar structures, and therefore are not described in detail. In addition, the accompanying drawings are merely exemplary diagrams of the disclosure, and are not drawn to scale.

Although relative terms such as "upper" and "lower" are used in the description to describe the relative relation between one component of the icon and another component, these terms are used in the description only for convenience, for example, according to the exemplary directions in the accompanying drawings. It can be understood that if the device of the icon is turned over and turned upside down, the component described as "upper" will become the "lower" component. When a certain structure is located "on" other structures, it may mean that a certain structure is integrally formed on other structures, or a certain structure is "directly"

disposed on other structures or a certain structure is "indirectly" disposed on other structures through another structure.

The terms "one", "a/an", "this", "the", and "at least one" are used to indicate the presence of one or more elements/components, etc. The terms "comprise" and "has/have" are used to indicate open-inclusion, and mean that additional elements/components, etc. may be presented in addition to the listed elements/components, etc. The terms "first", "second", "third", etc. are used only as distinctions, not to limit the number of corresponding objects.

With the continuous development of the semiconductor technology, the size of a semiconductor device such as a DRAM is continuously decreased. In a smaller and smaller integrated circuit, how to manufacture a capacitor having a higher capacitance is one of problems that need to be solved urgently in the development of semiconductors.

A capacitance of a semiconductor structure such as a capacitor is usually increased by reducing a thickness of a dielectric layer or using a material having a better dielectric constant. At present, the thickness of the dielectric layer is close to the limit of the quantum tunneling effect, which is likely to cause an increase in leakage current. Moreover, the use of materials having high dielectric constant, such as precious metal will greatly increase the manufacturing cost of DRAM. It is difficulty to introduce new materials having high dielectric constant into the current manufacturing process of a semiconductor device.

As shown in FIG. 1, the disclosure provides a method for manufacturing a semiconductor structure, including the following operations.

At S100, a substrate is provided.

At S200, a lower electrode is formed on the substrate.

At S300, a capacitor dielectric layer is formed on a surface of the lower electrode, and the capacitor dielectric layer includes at least one zirconium oxide layer.

At S400, the capacitor dielectric layer is subjected with a microwave annealing treatment, to convert a crystal phase of zirconium oxide to a tetragonal crystal phase.

At S500, an upper electrode is formed on a surface of the capacitor dielectric layer.

Regarding the method for manufacturing a semiconductor structure provided in the disclosure, the capacitor dielectric layer formed thereby includes a zirconium oxide layer. The capacitor dielectric layer after the formation is subjected with a microwave annealing treatment that can change a crystal phase of zirconium oxide. Therefore, the crystal phase of zirconium oxide is converted from a monoclinic phase to a tetragonal crystal phase, increasing the dielectric constant of zirconium oxide and the capacitance of the semiconductor structure. In the embodiments of the disclosure, the dielectric constant of the capacitor dielectric layer is increased only by performing the microwave annealing treatment, without changing the material of the capacitor dielectric layer. The method is simple in process and low in cost, and has a high application value. In addition, the semiconductor structure obtained by applying the method is suitable for various semiconductor memories, e.g. the DRAM. Moreover, the manufacturing method is simple, and can be suitable for large scale industrial production.

The operations in FIG. 1 of the disclosure are described as follows in detail with reference to the accompanying drawings.

Figure 2:
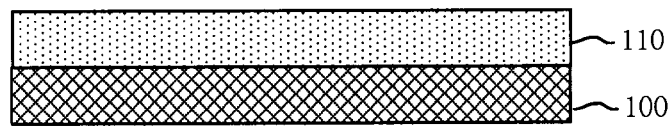
FIG. 2 schematically shows a structure of forming a lower electrode in exemplary embodiments of the disclosure.

At S100, a substrate is provided. As shown in FIG. 2, a substrate 100 is provided. The material of the substrate may include titanium nitride, tantalum nitride, etc., and is not limited.

At S200, a lower electrode is formed.

FIG. 2 to FIG. 6 show semiconductor structures manufactured in some embodiments of the disclosure. As shown in FIG. 2, a lower electrode 110 is formed on a substrate 100 by means of a sputtering or deposition process. The lower electrode 110 may be a polysilicon electrode or a metal electrode such as titanium nitride, tantalum nitride, and tungsten nitride. In one embodiment of the disclosure, the lower electrode 110 is made by titanium nitride (TiN).

At S300, a capacitor dielectric layer is formed on a surface of the lower electrode, and the capacitor dielectric layer includes at least one zirconium oxide layer.

In some embodiments of the disclosure, the capacitor dielectric layer further includes at least one first dielectric layer. The first dielectric layer and a zirconium oxide layer are stacked alternately. In one specific embodiment, the capacitor dielectric layer includes two the zirconium oxide layers and one the first dielectric layer. The zirconium oxide layers and the first dielectric layer are stacked alternately. In this embodiment, at S300, the formation of the capacitor dielectric layer includes the following operations.

At S310, a first zirconium oxide layer is formed on a surface of a lower electrode.

At S320, a first dielectric layer is formed on a surface of the zirconium oxide layer.

At S330, a second zirconium oxide layer is formed on a surface of the first dielectric layer.

Figure 3:
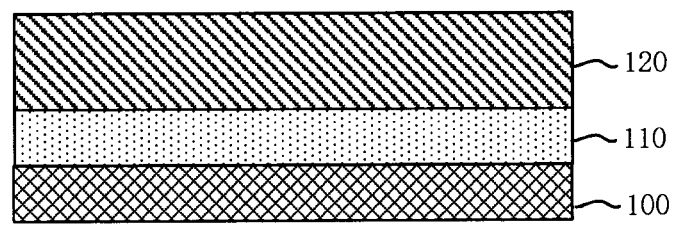
FIG. 3 schematically shows a structure of forming a zirconium oxide layer in exemplary embodiments of the disclosure.

At S310, as shown in FIG. 3, the first zirconium oxide layer 120 is formed on a surface of a lower electrode 110. The first zirconium oxide layer 120 is formed on an upper surface of the lower electrode 110 by means of a Chemical Vapor Deposition (CVD) process or an Atomic layer deposition (ALD) process. CVD is a process in which generate solid are deposited via the reaction of gaseous or vaporous substances on the gas phase or gas-solid interface. The CVD process may be selected from Atmospheric Pressure Chemical Vapor Deposition (APCVD), Low Pressure Chemical Vapor Deposition (LPCVD), Ultrahigh Vacuum Chemical Vapor Deposition (UHVCVD), Laser Chemical Vapor Deposition (LCVD), etc. ALD is a process in which substances can be deposited layer by layer on a surface of a substrate in the form of a monoatomic film.

In some embodiments of the disclosure, as shown in FIG. 3, the first zirconium oxide layer 120 is formed on the surface of the lower electrode 110. In some embodiments of the disclosure, the first zirconium oxide layer 120 may be formed by using ALD process. Specifically, ALD process is implemented by repeating the unit deposition cycle until the desired thickness is reached. In some embodiments, the thickness of the first zirconium oxide layer 120 may be 15-25 nm. Specifically, the thickness may be 15 nm, 16 nm, 17 nm, 18 nm, 19 nm, 20 nm, 21 nm, 22 nm, 23 nm, 24 nm, or 25 nm. In preferred embodiments of the disclosure, the thickness of the first zirconium oxide layer 120 may be 20 nm. As shown in FIG. 3, the unit deposition cycle is used in a deposition process of the first zirconium oxide layer 120. The number of cycles is set according to actual requirements. The unit deposition cycle includes the introduction of a zirconium source, the introduction of a first cleaning gas, the introduction of a reaction gas, and the introduction of a second cleaning gas. The zirconium source may be selected from $ZrCl_4$, $Zr(N(CH_3)C_2H_5)_4$, $Zr(O\text{-}tBu)_4$, $Zr(N(CH_3)_2)_4$, $Zr(N(C_2H_5)(CH_3))_4$, $Zr(N(C_2H_5)_2)_4$, $Zr(TMHD)_4$, $Zr(OiC_3H_7)_3(TMTD)$ or $Zr(OrBu)_4$. Both the first cleaning gas and the second cleaning gas may be nitrogen ($N_2$) or argon ($Ar_2$). The reaction gas includes one selected from ozone ($O_3$), oxygen ($O_2$), and water ($H_2O$). The zirconium source is introduced into a reaction chamber, and a lower electrode 110 absorbs the zirconium source. The first cleaning gas is introduced, and the part of the zirconium source which is not absorbed is removed from the reaction chamber. The reaction gas is introduced, and flown into the reaction chamber to react with the absorbed zirconium source, so as to form the first zirconium oxide layer 120 by deposition. The second cleaning gas is introduced to remove the unreacted reaction gas and reaction byproducts from the reaction chamber.

Figure 4:
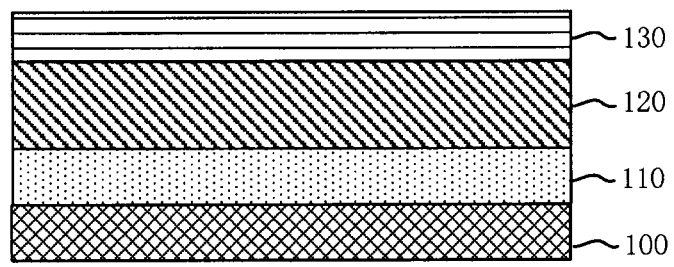
FIG. 4 schematically shows a structure of forming a first dielectric layer in exemplary embodiments of the disclosure.

At S320, as shown in FIG. 4, the first dielectric layer 130 is formed on the surface of the first zirconium oxide layer 120. In some embodiments of the disclosure, the first dielectric layer 130 is formed by using the ALD process. The first dielectric layer 130 is an aluminum oxide layer. Specifically, the ALD process is implemented by repeating the unit deposition cycle until the desired thickness is reached. In some embodiments, the thickness of the first dielectric layer 130 may be 1-5 nm. Specifically, the thickness may be 1 nm, 2 nm, 3 nm, 4 nm, or 5 nm. In preferred embodiments of the disclosure, the thickness of the first dielectric layer 130 may be 2 nm. That is, the thickness of the aluminum oxide layer is 2 nm. As shown in FIG. 4, the unit deposition cycle is used in a deposition process of the aluminum oxide layer. The number of cycles is set according to actual requirements. The unit deposition cycle includes the introduction of an aluminum source, the introduction of a first cleaning gas, the introduction of a reaction gas, and the introduction of a second cleaning gas. The aluminum source is selected from $Al(CH_3)_3$, $Al(C_2H_5)_3$ or other Al-containing organic metal compounds. Both the first cleaning gas and the second cleaning gas are nitrogen ($N_2$) or argon ($Ar_2$). The reaction gas includes one selected from ozone ($O_3$), oxygen ($O_2$), and water ($H_2O$). The specific deposition process is the same as the deposition step of the first zirconium oxide layer 120, and is not described here again.

Figure 5:
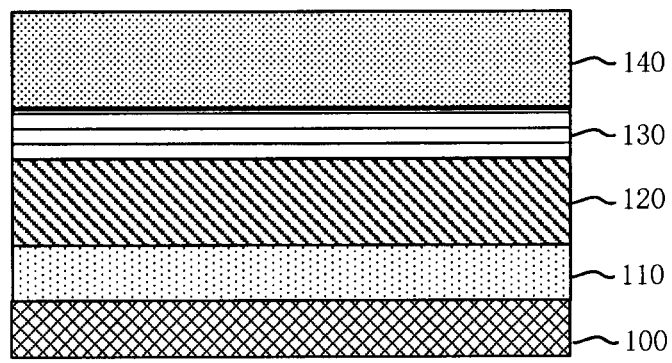
FIG. 5 schematically shows a structure of forming another zirconium oxide layer in exemplary embodiments of the disclosure.

At S330, as shown in FIG. 5, the second zirconium oxide layer 140 is formed on the surface of the first dielectric layer 130. In some embodiments of the disclosure, the second zirconium oxide layer 140 is formed by using the ALD process. Specifically, the ALD process is implemented by repeating the unit deposition cycle until the desired thickness is reached. In some embodiments, the thickness of the second zirconium oxide layer 140 may be 15-25 nm. Specifically, the thickness may be 15 nm, 16 nm, 17 nm, 18 nm, 19 nm, 20 nm, 21 nm, 22 nm, 23 nm, 24 nm, or 25 nm. In preferred embodiments of the disclosure, the thickness of the second zirconium oxide layer 140 is 20 nm. The deposition process of the second zirconium oxide layer 140 in this operation is the same as the step S310, and is not described here again.

At S400, the capacitor dielectric layer is subjected with a microwave annealing treatment, to convert a crystal phase of zirconium oxide to a tetragonal crystal phase.

Figure 7:
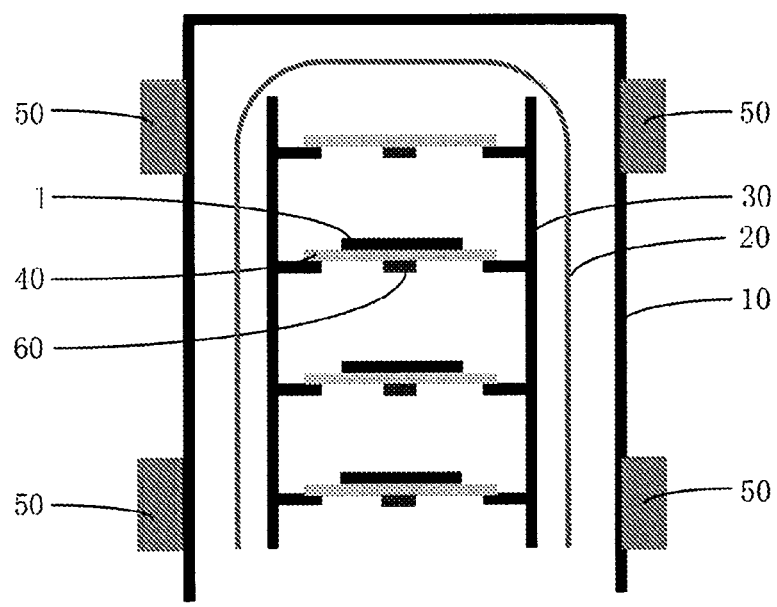
FIG. 7 schematically shows a structure of a device for microwave annealing treatment in exemplary embodiments of the disclosure.

In this operation, the structure 1 on which the capacitor dielectric layer is formed, is subjected with a microwave annealing treatment in a copper chamber. As shown in FIG. 7, a device for microwave treatment may be a batch type device for microwave annealing. The microwave annealing device includes a copper chamber 10. The copper chamber 10 is provided with a quartz chamber 20. The quartz chamber 20 is provided with an assembly holder 30. The assembly holder 30 is also made of quartz. The assembly holder 30 is provided with a plurality of support substrates 40. Each support substrate 40 is provided with an infrared sensor 60 used for measuring the temperature of the support substrate 40. A microwave structure 50 is provided at the periphery of the copper chamber 10. A microwave power of the microwave structure 50 is adjustable. The structure 1 having the capacitor dielectric layer formed is placed onto the support substrate 40 for performing the microwave annealing treatment.

In some embodiments of the disclosure, the microwave annealing treatment may be performed under a power of 700 W to 1,400 W. Specifically, the power may be 700 W, 800 W, 900 W, 1,000 W, 1,050 W, 1,100 W, 1,200 W, 1,300 W or 1,400 W. The microwave annealing treatment may be performed for a time period of 250 s to 310 s. Specifically, the time period may be 250 s, 260 s, 270 s, 280 s, 290 s, 300 s, 305 s or 310 s. In preferred embodiments of the disclosure, the microwave may have the power of 700-1,400 W, and may last for 300 s. In more preferred embodiments, the microwave has the power of 1,400 W, and lasts for 300 s.

At S500, an upper electrode is formed on a surface of the capacitor dielectric layer.

Figure 6:
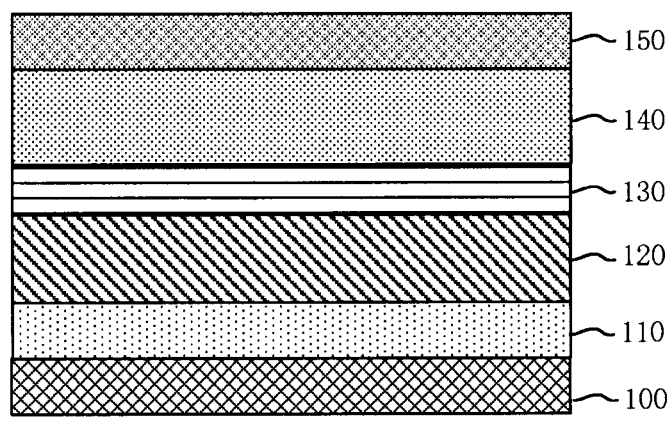
FIG. 6 schematically shows a structure of forming an upper electrode in exemplary embodiments of the disclosure.

As shown in FIG. 6, an upper electrode 150 is formed on the surface of the second zirconium oxide layer 140. A formation method and material of the upper electrode 150 may be the same as or different from those of the lower electrode 110, which are not limited. In some embodiments of the disclosure, the material of the upper electrode 150 is the same as that of the lower electrode 110, i.e., titanium nitride. As a result, the semiconductor structure is formed as shown in FIG. 6.

Taking a semiconductor structure that is not subjected with a microwave annealing treatment as the reference, the processed capacitor dielectric layer subjected with a microwave annealing treatment and the prepared semiconductor structure are tested. The semiconductor structure to be tested includes the lower electrode 110, the first zirconium oxide layer 120, the first dielectric layer 130, the second zirconium oxide layer 140, and the upper electrode 150. The lower electrode 110 and the upper electrode 150 are made of titanium nitride. The first dielectric layer 130 is an aluminum oxide layer. The thickness of the first zirconium oxide layer 120 is 20 nm. The thickness of the first dielectric layer 130 is 5 nm. The thickness of the second zirconium oxide layer 140 is 20 nm. The structure during the microwave annealing treatment includes the lower electrode 110, the first zirconium oxide layer 120, the first dielectric layer 130, and the second zirconium oxide layer 140. The microwave annealing treatment is performed under conditions of a power being 700 W, 1,050 W, or 1,400 W, and a treatment time being 300 s.

Figure 8:
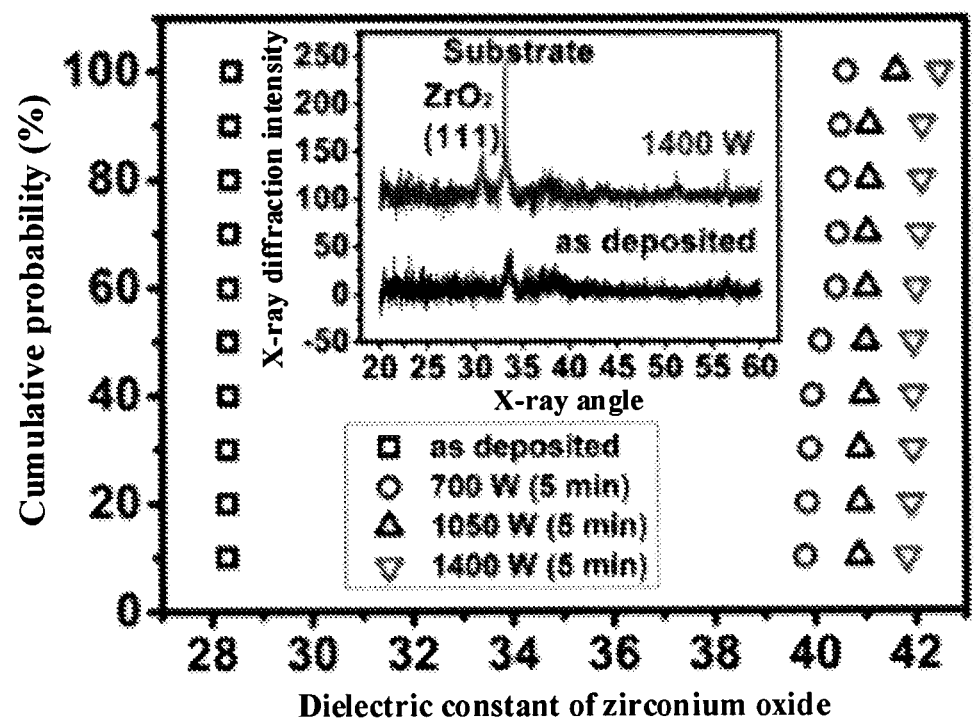
FIG. 8 shows a result obtained by microwave annealing treatment in exemplary embodiments of the disclosure.
Figure 9:
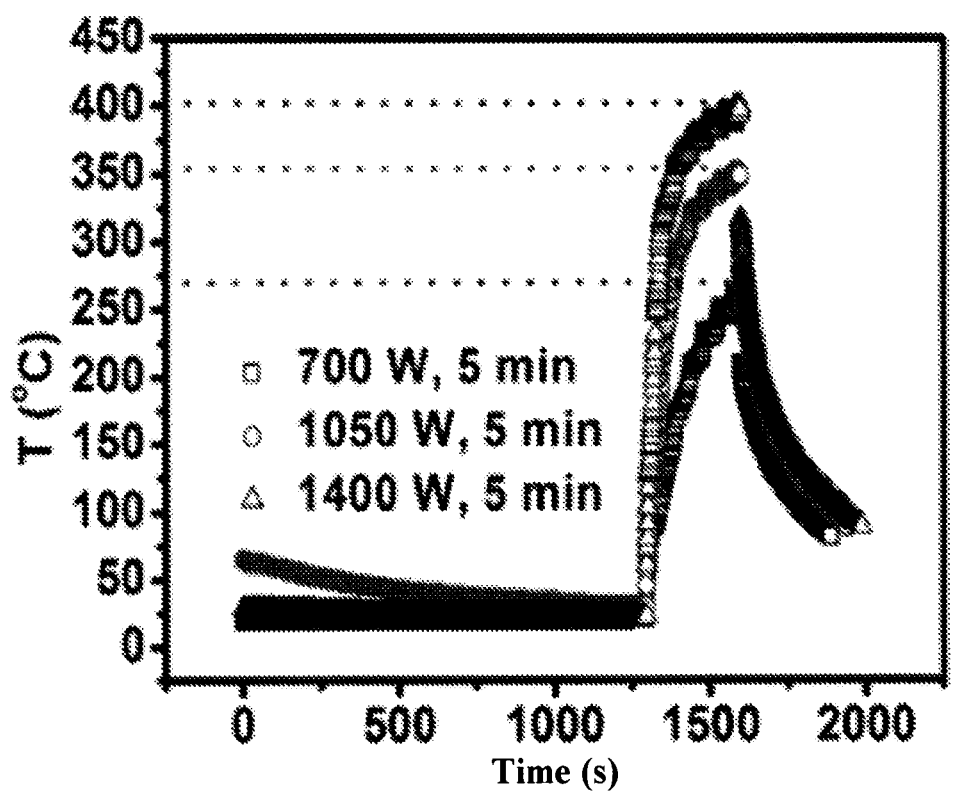
FIG. 9 shows another result obtained by microwave annealing treatment in exemplary embodiments of the disclosure.
Figure 10:
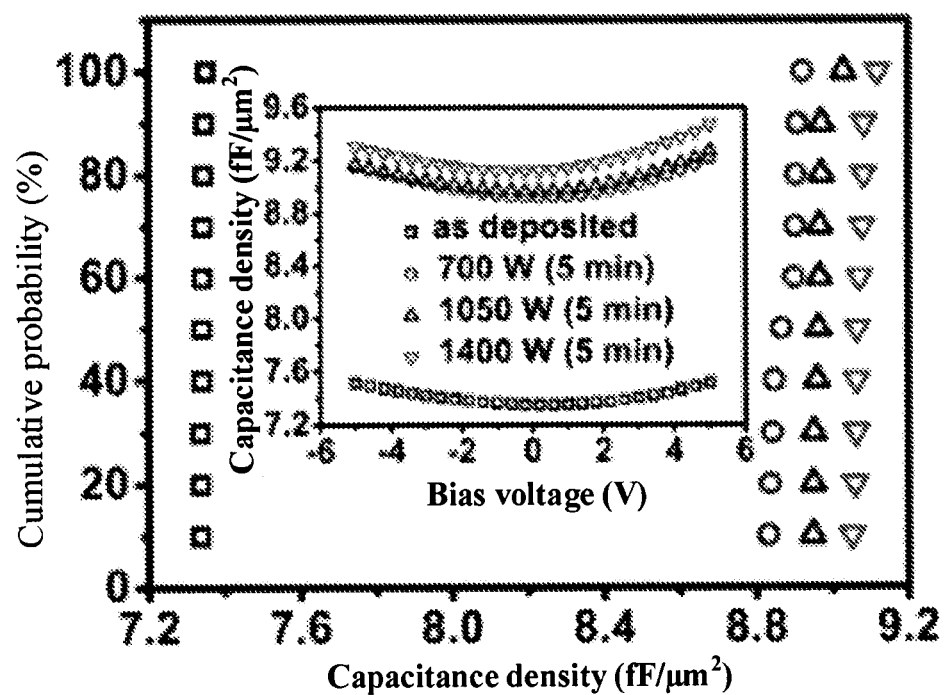
FIG. 10 shows another result obtained by microwave annealing treatment in exemplary embodiments of the disclosure.

The test results show that: (1) Upon the microwave annealing treatment, a crystal phase of zirconium oxide is converted from a monoclinic phase to a tetragonal crystal phase, and a dielectric constant of zirconium oxide is greatly increased. As shown in FIG. 8, a horizontal coordinate of an outer frame coordinate system denotes the dielectric constant of zirconium oxide, and a vertical coordinate denotes the cumulative probability of the dielectric constant of the zirconium oxide. It can be seen from this figure that the dielectric constant of the zirconium oxide is significantly increased after performing the microwave annealing treatment for 300 s at a power of 700 W, 1,050 W, or 1,400 W. The dielectric constant of the zirconium oxide is increased from 29.3 to 41.9 after performing the microwave treatment for 300 s at the power of 1,400 W, and thus is increased by about 43%. As also shown in FIG. 8, a horizontal coordinate of an inner frame coordinate system denotes an X-ray angle, and a vertical coordinate denotes an X-ray diffraction intensity. It can be seen from this figure that there is a peak at an angle of 30.7, and at this time, a crystal phase of the zirconium oxide is converted to a tetragonal crystal phase. (2) After the microwave annealing treatment, the formed substrate including the lower electrode and the capacitor dielectric layer has a temperature not greater than 400° C. Specifically, in the test, the temperature of the substrate including the lower electrode 110, the first zirconium oxide layer 120, the first dielectric layer 130, and the second zirconium oxide layer 140 is not greater than 400° C. Specifically as shown in FIG. 9, a horizontal coordinate denotes a manufacturing time of a manufacturing process of a semiconductor structure. A microwave annealing treatment may be carried out at about 1,300-1,600 s. A vertical coordinate denotes a temperature of the substrate. It can be seen from this figure that, after performing the microwave annealing treatment for 300 s at the power of 700 W, 1,050 W, or 1,400 W, the temperature of the substrate including the lower electrode 110, the first zirconium oxide layer 120, the first dielectric layer 130, and the second zirconium oxide layer 140 is increased, while the highest temperature is 400° C., which satisfies the temperature requirement during the process for manufacturing the semiconductor structure. During the process for manufacturing the semiconductor structure, the temperature should not be too high; otherwise, the wafer may be warped and the mechanical properties of the structure may be affected. (3) After performing the microwave annealing treatment, a capacitance of the obtained semiconductor structure is greatly increased. As shown in FIG. 10, a horizontal coordinate of a large frame coordinate system denotes a capacitance density, and a horizontal coordinate denotes a cumulative probability of the capacitance density. It can be seen from this figure that the capacitance density of the semiconductor structure is greatly increased after performing a microwave annealing treatment for 300 s at the power of 700 W, 1,050 W, or 1,400 W. The capacitance density of the semiconductor structure is increased from 7.34 fF/$\mu m^2$ to 9.06 fF/$\mu m^2$ after performing a microwave treatment for 300 s at the power of 1,400 W. With continued reference to FIG. 10, a horizontal coordinate of a small frame coordinate system denotes a bias voltage, and a vertical coordinate denotes a capacitance density. It can be seen from this figure that when different bias voltages are applied, the capacitance densities are slightly changed. When the bias voltage is 0 V, the capacitance density of the semiconductor structure is increased from 7.34 fF/$\mu m^2$ to 9.06 fF/$\mu m^2$ after performing the microwave treatment for 300 s at the power of 1,400 W.

The disclosure also provides a semiconductor structure. The semiconductor structure includes a substrate, an upper electrode, a capacitor dielectric layer, and a lower electrode. The lower electrode is located on the substrate. The capacitor dielectric layer is provided on a surface of the lower electrode, and includes at least one zirconium oxide layer. Zirconium oxide in the zirconium oxide layer is in crystal phase of a tetragonal crystal phase. The upper electrode is provided on a surface of the capacitor dielectric layer away from the lower electrode. The capacitor dielectric layer further includes at least one first dielectric layer. The first dielectric layer and the zirconium oxide layer are stacked alternately. Each the first dielectric layer has the thickness of 1-5 nm. Each the zirconium oxide layer has the thickness of 15-25 nm. The first dielectric layer is made of aluminum oxide. In one specific embodiment, as for the semiconductor structure as shown in FIG. 6, the capacitor dielectric layer includes two the zirconium oxide layers and one the first dielectric layer, and the zirconium oxide layers and the first dielectric layer are stacked alternately. Specifically, the semiconductor structure includes the substrate 100, the lower electrode 110, the first zirconium oxide layer 120, the first dielectric layer 130, the second zirconium oxide layer 140, and the upper electrode 150. The first zirconium oxide layer 120 or the second zirconium oxide layer 140 has the thickness of 15-25 nm. Specifically, the thickness may be 15 nm, 16 nm, 17 nm, 18 nm, 19 nm, 20 nm, 21 nm, 22 nm, 23 nm, 24 nm, or 25 nm. The first dielectric layer 130 has a thickness of 1-5 nm. Specifically, the thickness may be 1 nm, 2 nm, 3 nm, 4 nm, or 5 nm. The material of the lower electrode 110 and the material of the upper electrode 130 include titanium nitride. A method for manufacturing the semiconductor structure is the same as the manufacturing method above for a semiconductor structure, and is not described here again.

The disclosure also provides a memory, including the semiconductor structure. For example, the DRAM includes a plurality of repeated storage units. The storage unit includes the semiconductor structure and a transistor.

It should be noted that the operations of XX methods in the disclosure are described in the particular order in the accompanying drawings, but it is not required or suggested that these operations need to be executed in the particular order or the desired result can be achieved only by executing all the shown operations. Additionally or optionally, some operations may be omitted, or the plurality of operations may be combined to perform in one operation, and/or one operation may be split into the plurality of operations, etc.

A person skilled in the art can easily obtain other implementation solutions of the disclosure after considering the description and practicing the solutions disclosed here. This application is intended to cover any variations, functions, or adaptive changes of the present application. These variations, functions, or adaptive changes comply with general principles of the disclosure, and include common general knowledge or common technical means in the technical field that are not disclosed in the disclosure. The description and embodiments are merely considered to be exemplary, and the actual scope and spirit of the disclosure are pointed out in the appended claims.

What is claimed is:

1. A method for manufacturing a semiconductor structure, comprising:
   providing a substrate;
   forming a lower electrode on the substrate;
   forming a capacitor dielectric layer on a surface of the lower electrode, wherein the capacitor dielectric layer comprises at least one zirconium oxide layer;
   subjecting the capacitor dielectric layer with a microwave annealing treatment performed in a copper chamber to convert a crystal phase of zirconium oxide to a tetragonal crystal phase; and
   forming an upper electrode on a surface of the capacitor dielectric layer.

2. The method of claim 1, wherein the microwave annealing treatment is performed under a power of 700 W to 1,400 W for 250 s to 310 s.

3. The method of claim 1, wherein the substrate having the lower electrode and the capacitor dielectric layer formed thereon has a temperature not greater than 400° C., during the microwave annealing treatment.

4. The method of claim 1, wherein the capacitor dielectric layer further comprises at least one first dielectric layer, and the first dielectric layer and the zirconium oxide layer are stacked alternately.

5. The method of claim 4, wherein the first dielectric layer comprises an aluminum oxide layer.

6. The method of claim 4, wherein the capacitor dielectric layer comprises two the zirconium oxide layers and one the first dielectric layer, and the zirconium oxide layers and the first dielectric layer are stacked alternately.

7. The method of claim 4, wherein each the first dielectric layer is formed with a thickness of 1 nm to 5 nm, and each of the zirconium oxide layers is formed with a thickness of 15 nm to 25 nm.

8. A method for manufacturing a semiconductor structure, comprising:

providing a substrate;

forming a lower electrode on the substrate;

forming a capacitor dielectric layer on a surface of the lower electrode, wherein the capacitor dielectric layer comprises at least one zirconium oxide layer;

subjecting the capacitor dielectric layer with a microwave annealing treatment to convert a crystal phase of zirconium oxide to a tetragonal crystal phase; and forming an upper electrode on a surface of the capacitor dielectric layer;

wherein the substrate having the lower electrode and the capacitor dielectric layer formed thereon has a temperature not greater than 400° C., during the microwave annealing treatment.

9. The method of claim 8, wherein the microwave annealing treatment is performed under a power of 700 W to 1,400 W for 250 s to 310 s.

10. The method of claim 8, wherein the capacitor dielectric layer further comprises at least one first dielectric layer, and the first dielectric layer and the zirconium oxide layer are stacked alternately.

11. The method of claim 10, wherein the first dielectric layer comprises an aluminum oxide layer.

12. The method of claim 10, wherein the capacitor dielectric layer comprises two the zirconium oxide layers and one the first dielectric layer, and the zirconium oxide layers and the first dielectric layer are stacked alternately.

13. The method of claim 10, wherein each the first dielectric layer is formed with a thickness of 1 nm to 5 nm, and each of the zirconium oxide layers is formed with a thickness of 15 nm to 25 nm.

* * * * *